United States Patent
Thibaut et al.

(10) Patent No.: US 11,533,830 B2
(45) Date of Patent: Dec. 20, 2022

(54) COOLING ARRANGEMENT HAVING PRIMARY AND SECONDARY COOLING DEVICES FOR COOLING AN ELECTRONIC DEVICE

(71) Applicant: OVH, Roubaix (FR)

(72) Inventors: Christophe Maurice Thibaut, Houplin Ancoisne (FR); Patrick-Gilles Maillot, Marsanne (FR); Henryk Klaba, Roubaix (FR)

(73) Assignee: OVH, Roubaix (FR)

( * ) Notice: Subject to any disclaimer, the term of this patent is extended or adjusted under 35 U.S.C. 154(b) by 101 days.

(21) Appl. No.: 16/784,422

(22) Filed: Feb. 7, 2020

(65) Prior Publication Data

US 2020/0281098 A1 Sep. 3, 2020

(30) Foreign Application Priority Data

Feb. 28, 2019 (EP) .................................. 19315013

(51) Int. Cl.
*G05B 19/406* (2006.01)
*H05K 7/20* (2006.01)

(52) U.S. Cl.
CPC ....... *H05K 7/20836* (2013.01); *G05B 19/406* (2013.01); *H05K 7/20154* (2013.01);
(Continued)

(58) Field of Classification Search
CPC ........... H05K 7/20836; H05K 7/20281; H05K 2201/066; G06F 1/206; G06F 1/20;
(Continued)

(56) References Cited

U.S. PATENT DOCUMENTS 6,182,742 B1 2/2001 Takahashi et al.
7,149,084 B2 12/2006 Matsushima et al.
(Continued)

FOREIGN PATENT DOCUMENTS

WO 2015058513 A1 4/2015
WO 2018/069633 A1 4/2018

OTHER PUBLICATIONS

European Search Report with regard to the counterpart EP Patent Application No. 19315013.3 completed Aug. 12, 2019.

*Primary Examiner* — Darrin D Dunn
(74) *Attorney, Agent, or Firm* — BCF LLP

(57) ABSTRACT

A cooling arrangement for an electronic device comprises a primary cooling device and a secondary cooling device. The primary cooling device includes a fluidic input line receiving a cooling fluid from a cooling fluid source and a fluidic output line returning the cooling fluid toward a drain. The primary cooling device is thermally connected to the electronic device, receives the cooling fluid from the fluidic input line and transfers heat from the electronic device to the cooling fluid before returning the cooling fluid via the fluidic output line. A flow detection device monitors a flow of the cooling fluid in the primary cooling device. The secondary cooling device is thermally connected to the electronic device. A processor activates the secondary cooling device to absorb and dissipate heat from the electronic device when the flow detection device detects a lack of flow of the cooling fluid in the primary cooling device.

20 Claims, 12 Drawing Sheets

(52) U.S. Cl.
CPC ..... *H05K 7/20209* (2013.01); *H05K 7/20336* (2013.01); *H05K 7/20736* (2013.01); *H05K 7/20818* (2013.01); *G05B 2219/49219* (2013.01)

(58) Field of Classification Search
CPC ............. G06F 2200/201; G06F 1/3206; G06F 11/1456; G06F 11/3058; G05B 15/02
See application file for complete search history.

(56) References Cited

U.S. PATENT DOCUMENTS

| | | | |
|---|---|---|---|
| 7,436,666 B1 * | 10/2008 | Konshak | G06F 1/20 361/699 |
| 7,975,156 B2 * | 7/2011 | Artman | H05K 7/20836 713/323 |
| 8,051,897 B2 | 11/2011 | Campbell et al. | |
| 8,274,790 B2 | 9/2012 | Campbell et al. | |
| 8,351,200 B2 | 1/2013 | Arimilli et al. | |
| 8,395,896 B2 | 3/2013 | Belady | |
| 9,291,408 B2 | 3/2016 | Iyengar et al. | |
| 9,297,559 B2 * | 3/2016 | Rangarajan | G06F 1/3287 |
| 9,313,930 B2 | 4/2016 | Goth et al. | |
| 9,494,371 B2 | 11/2016 | Werner et al. | |
| 9,769,954 B2 | 9/2017 | Bonnin et al. | |
| 9,943,014 B2 | 4/2018 | Lyon et al. | |
| 2005/0115257 A1 * | 6/2005 | Goth | H05K 7/20827 62/186 |
| 2005/0174733 A1 * | 8/2005 | Novotny | G06F 1/206 361/695 |
| 2007/0119569 A1 | 5/2007 | Campbell et al. | |
| 2007/0153474 A1 | 7/2007 | Andersen et al. | |
| 2008/0266726 A1 | 10/2008 | Murakami et al. | |
| 2010/0067193 A1 | 3/2010 | Arimilli et al. | |
| 2010/0070475 A1 * | 3/2010 | Chen | G06F 11/1451 707/640 |
| 2011/0169650 A1 * | 7/2011 | Holloway | G08B 21/187 340/653 |
| 2013/0091866 A1 | 4/2013 | Campbell et al. | |
| 2013/0094146 A1 * | 4/2013 | Tufty | G06F 1/20 361/699 |
| 2013/0205822 A1 | 8/2013 | Heiland et al. | |
| 2014/0202678 A1 * | 7/2014 | Goth | F28F 27/02 165/287 |
| 2015/0355630 A1 * | 12/2015 | Cader | G05B 19/408 700/9 |
| 2016/0120059 A1 | 4/2016 | Shedd et al. | |
| 2017/0303441 A1 * | 10/2017 | Farshchian | H05K 7/20309 |
| 2018/0003451 A1 | 1/2018 | Azar et al. | |
| 2019/0069447 A1 * | 2/2019 | Sasaki | H05K 7/20763 |
| 2020/0053916 A1 * | 2/2020 | Bonnin | H05K 7/20736 |
| 2020/0217599 A1 * | 7/2020 | Narasimhan | H05K 7/20 |
| 2021/0068300 A1 * | 3/2021 | Chehade | H05K 7/2079 |

* cited by examiner

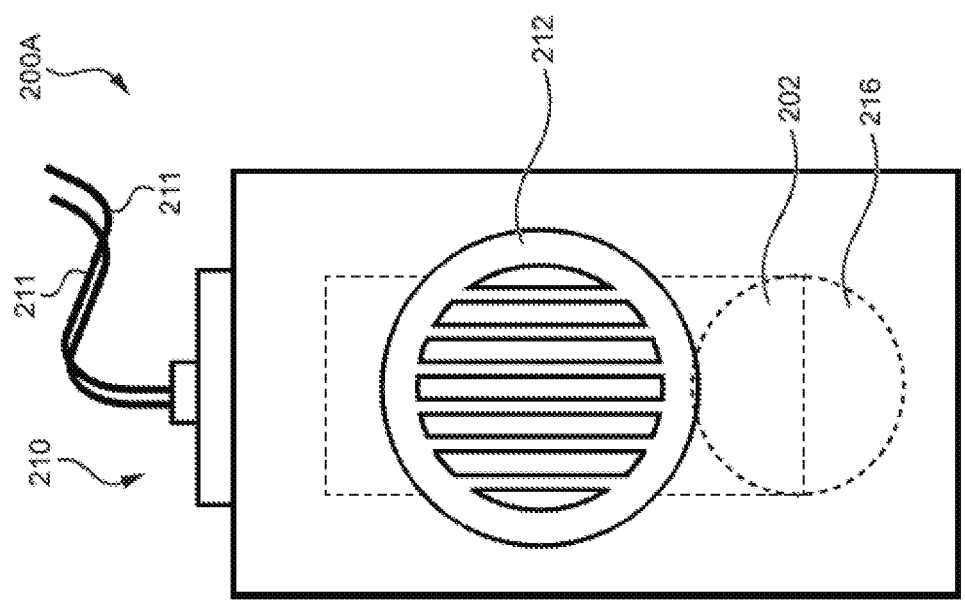
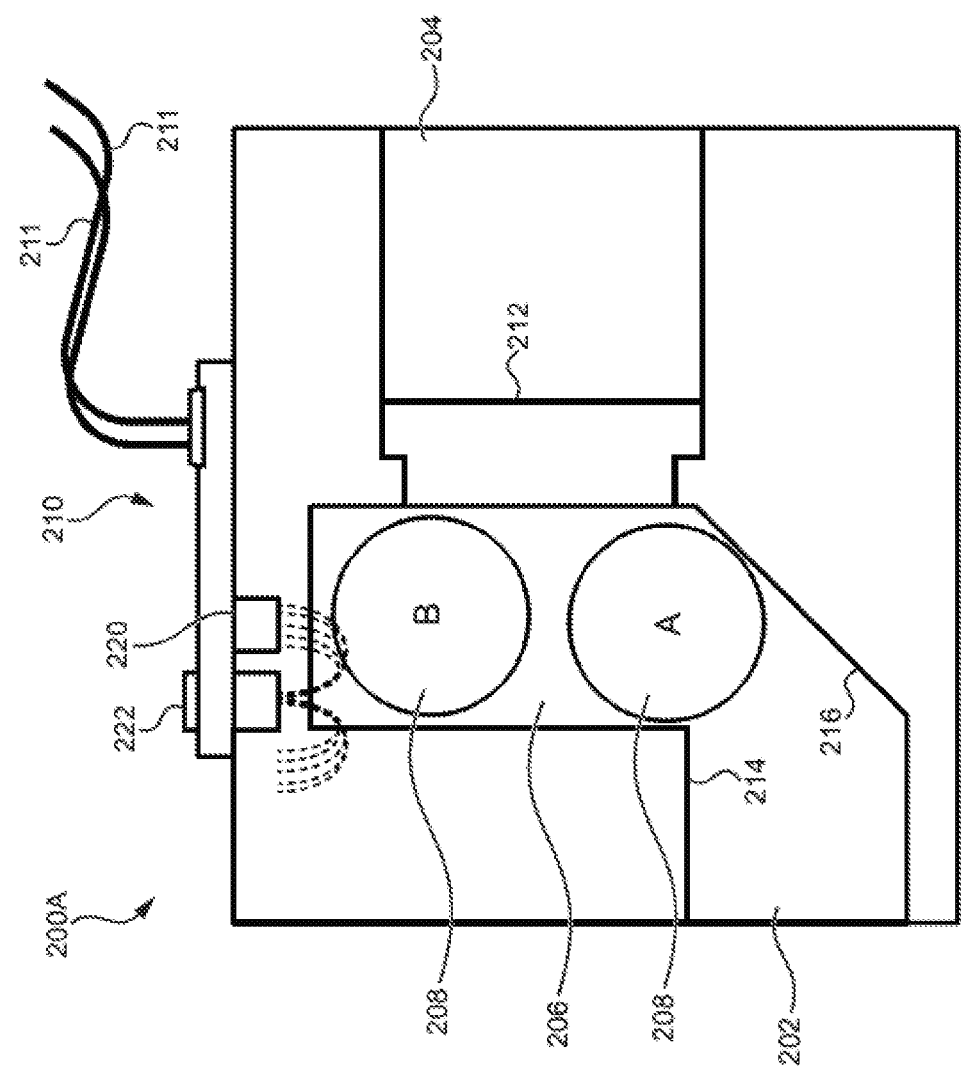
Figure 5b
Figure 5a

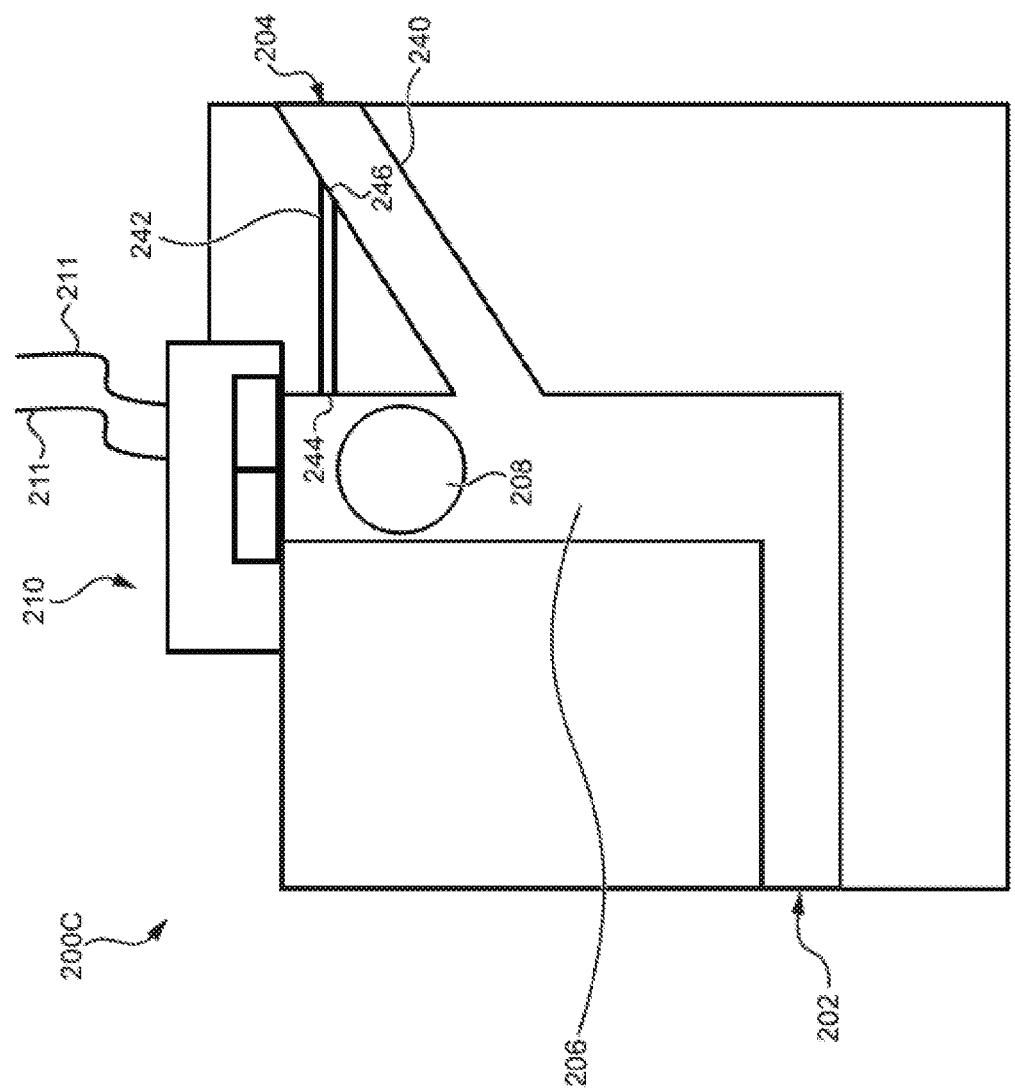

COOLING ARRANGEMENT HAVING PRIMARY AND SECONDARY COOLING DEVICES FOR COOLING AN ELECTRONIC DEVICE

CROSS-REFERENCE

The present application claims priority from European Patent Application no. 19315013.3, filed on Feb. 28, 2019, the disclosure of which is incorporated by reference herein.

FIELD

The present technology relates to cooling techniques for electronic devices. In particular, a cooling arrangement having primary and secondary cooling devices for cooling an electronic device is disclosed.

BACKGROUND

Electronic components, for example servers, memory banks, computer discs, and the like, are conventionally grouped in equipment racks. Large data centers that may contain thousands of racks supporting thousands or even tens of thousands of servers.

The racks, including equipment mounted in their backplanes, consume large amounts of electric power and generate significant amounts of heat. Cooling needs are important in such racks. Some electronic devices, such as processors, generate so much heat that they could fail within seconds in case of a lack of cooling.

Liquid-cooling, for example water-cooling, is increasingly used to preserve safe operating temperatures of servers and like equipment mounted in racks. However, impurities in liquid may lead to blockage of small conduits, loss of cooling and component failure.

A common solution used to monitor proper liquid cooling and to prevent, at least to some extent, cooling failures is to install flow indicators and/or flowmeters that keep track of liquid cooling delivery into server racks. For example, a simple indicator per rack may visually show whether a cooling flow is properly delivered to each rack. However, a large number of individual components may be received in a single rack. Loss of cooling at the level of a single component may not be properly detected by a flow indicator or flowmeter that monitors the cooling flow for the rack as a whole. The loss of that single component may lead to the loss of service and/or loss of critical data for a client of a datacenter.

Current flowmeters are fairly expensive and cannot economically be used to detect the flow of cooling fluid delivered to each component installed in a rack. Available flowmeters are bulky and cannot be used in racks where space is limited, particularly in typical racks that allocate space to components in rack units (U) of 44.45 mm in height, especially when many components occupy a single U.

In case of a loss of cooling, some electronic devices may overheat very rapidly and may fail within a few seconds. Important losses of information, for example customer data, may be lost if an overheating electronic device fails or is switched off too rapidly.

Even though the recent developments identified above may provide benefits, improvements are still desirable.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches.

SUMMARY

Embodiments of the present technology have been developed based on developers' appreciation of shortcomings associated with the prior art.

In particular, such shortcomings may comprise (1) the large size of current flowmeters; (2) the bulkiness of current flowmeters; (3) the lack of detectability of cooling losses at a component level; and/or (4) potential loss of information and data when an electronic device fails or is switched off too rapidly.

In one aspect, various implementations of the present technology provide a cooling arrangement for an electronic device, comprising:
  a cooling fluid circuit including:
    a fluidic input line adapted for receiving a cooling fluid from a cooling fluid source, and
    a fluidic output line adapted for returning the cooling fluid toward a drain;
  a primary cooling device adapted to be thermally connected to the electronic device, to receive the cooling fluid from the fluidic input line and to transfer heat from the electronic device to the cooling fluid before returning the cooling fluid via the fluidic output line;
  a flow detection device operable to monitor a flow of the cooling fluid in the cooling fluid circuit;
  a secondary cooling device adapted to be thermally connected to the electronic device and operable to absorb and dissipate heat from the electronic device; and
  a processor operatively connected to the flow detection device and to the secondary cooling device, the processor being configured to cause an activation of the secondary cooling device when receiving, from the flow detection device, an indication of a lack of flow of the cooling fluid in the primary cooling device.

In some implementations of the present technology, the primary cooling device is adapted to be mounted on the electronic device.

In some implementations of the present technology, the secondary cooling device comprises at least one heat pipe having an evaporator portion adapted to be thermally connected to the electronic device and a condenser portion thermally connected to a heat sink.

In some implementations of the present technology, the evaporator portion of the at least one heat pipe is adapted to be mounted on the primary cooling device.

In some implementations of the present technology, the heat sink comprises a thermoelectric cooling element activable by the processor.

In some implementations of the present technology, the heat sink comprises: a radiator; and an electric fan activable by the processor and configured to provide forced air cooling to the radiator.

In some implementations of the present technology, the secondary cooling device comprises a thermoelectric cooling element activable by the processor and adapted to be thermally connected to the primary cooling device.

In some implementations of the present technology, the thermoelectric cooling element is adapted to be mounted on the primary cooling device.

In some implementations of the present technology, the processor is operatively connected to the electronic device; and the processor is further configured to cause a shutdown of the electronic device in response to receiving the lack of flow indication from the flow detection device.

In some implementations of the present technology, the processor is operatively connected to the electronic device; and the processor is further configured to: transmit a fault signal toward a remote processor when receiving the lack of flow indication from the flow detection device, receive a shutdown command from the remote processor, and cause a shutdown of the electronic device in response to receiving the shutdown command.

In some implementations of the present technology, the cooling arrangement further comprises a main processor communicatively coupled to the processor and to the electronic device, so that, in operation: the processor transmit a fault signal toward the main processor when receiving the lack of flow indication from the flow detection device; the main processor fetches operational information from the electronic device in response to receiving the fault signal; the main processor transfers the fetched operational information to an other electronic device; after transferring the fetched operational information to the other electronic device, the main processor forwards a shutdown command to the processor; and the processor causes a shutdown of the electronic device in response to receiving the shutdown command.

In other aspects, various implementations of the present technology provide a method for cooling an electronic device, comprising:
  monitoring a flow of a cooling fluid in a primary cooling device thermally connected to the electronic device; and
  activating a secondary cooling device in response to detecting that the flow of the cooling fluid in the primary cooling device is insufficient to absorb and dissipate heat from the electronic device.

In some implementations of the present technology, the method further comprises monitoring a temperature of the electronic device; and activating the secondary cooling device in response to detecting that the electronic device exceeds a normal temperature level.

In some implementations of the present technology, the method further comprises turning off the electronic device in response to detecting that the electronic device meets or exceed a critical temperature level.

In some implementations of the present technology, the method further comprises transferring data and operations from the electronic device to another device before turning off the electronic device.

In the context of the present specification, unless expressly provided otherwise, a computer system may refer, but is not limited to, an "electronic device", an "operation system", a "system", a "computer-based system", a "controller unit", a "monitoring device", a "control device" and/or any combination thereof appropriate to the relevant task at hand.

In the context of the present specification, unless expressly provided otherwise, the expression "computer-readable medium" and "memory" are intended to include media of any nature and kind whatsoever, non-limiting examples of which include RAM, ROM, disks (CD-ROMs, DVDs, floppy disks, hard disk drives, etc.), USB keys, flash memory cards, solid state-drives, and tape drives. Still in the context of the present specification, "a" computer-readable medium and "the" computer-readable medium should not be construed as being the same computer-readable medium. To the contrary, and whenever appropriate, "a" computer-readable medium and "the" computer-readable medium may also be construed as a first computer-readable medium and a second computer-readable medium.

In the context of the present specification, unless expressly provided otherwise, the words "first", "second", "third", etc. have been used as adjectives only for the purpose of allowing for distinction between the nouns that they modify from one another, and not for the purpose of describing any particular relationship between those nouns.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

For a better understanding of the present technology, as well as other aspects and further features thereof, reference is made to the following description which is to be used in conjunction with the accompanying drawings, where:

FIG. 5a is a side elevation, schematic view of a flow detection device in accordance with an embodiment of the present technology;

FIG. 5b is a rear elevation, schematic view of the flow detection device of FIG. 5a in accordance with an embodiment of the present technology;

FIG. 7 is a side elevation, schematic view of yet another flow detection device in accordance with an embodiment of the present technology;

Figure 1:
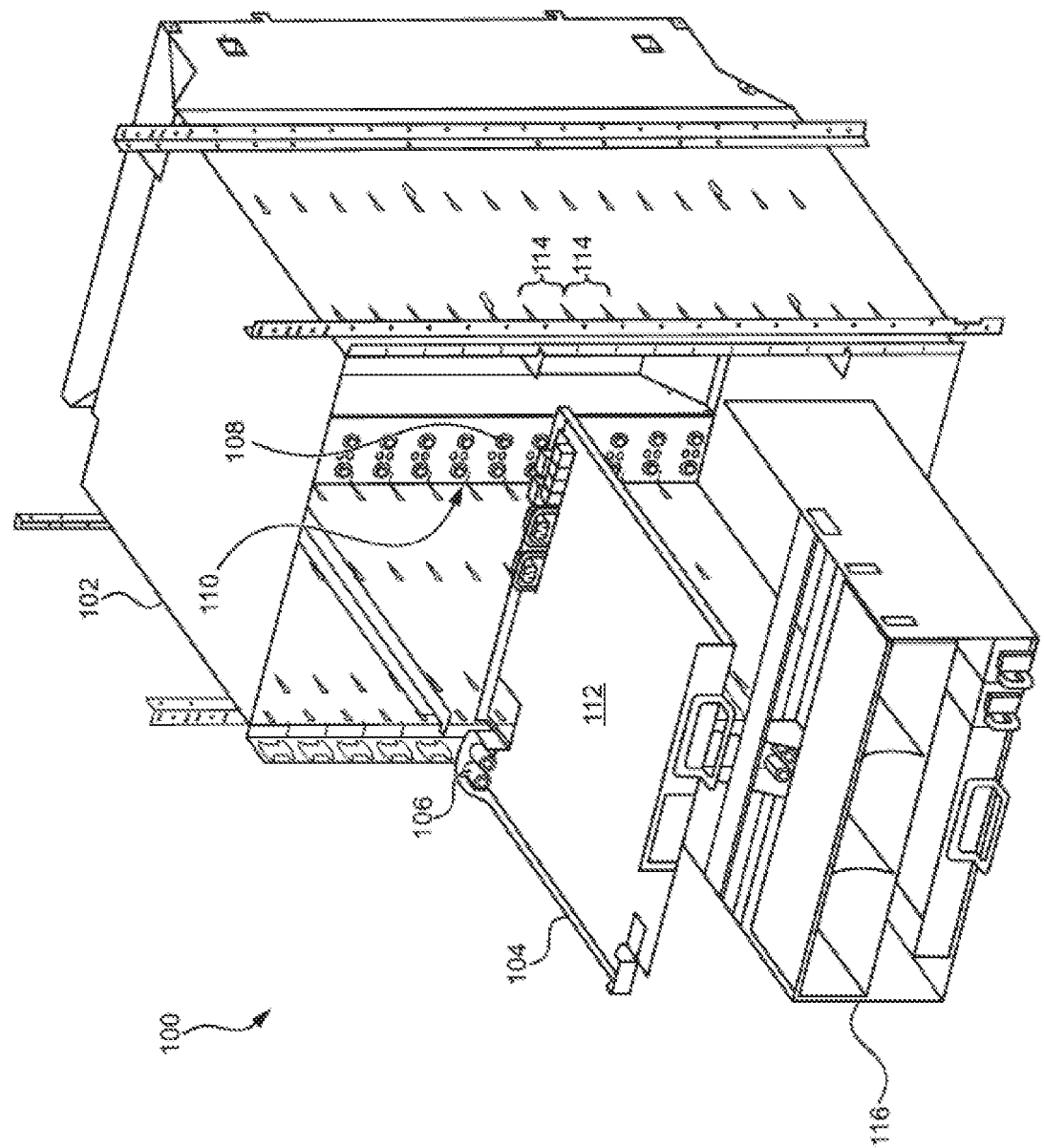
FIG. 1 is a is a front perspective view of a system comprising a rack and at least one insertable component in accordance with an embodiment of the present technology.

It should also be noted that, unless otherwise explicitly specified herein, the drawings are not to scale.

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

The functions of the various elements shown in the figures, including any functional block labeled as a "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. In some embodiments of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown. Moreover, it should be understood that module may include for example, but without being limitative, computer program logic, computer program instructions, software, stack, firmware, hardware circuitry or a combination thereof which provides the required capabilities.

In an aspect, the present technology a flow detection device is connectable to a flow line, for example a water line, and is configured to detect the presence or absence of a liquid flow in the flow line. Liquid is received from the flow line at a fluidic input port of the flow detection device and returned to the flow line via a fluidic output port of the flow detection device. A float is positioned in a channel, between the fluidic input and output ports. The float falls to the bottom of the channel in the absence of a liquid flow and rises in the channel in the presence of a liquid flow. A sensor detects the position of the float in the channel for determining whether the liquid flow is present or absent. The flow detection device may be configured to provide a binary indication that a liquid flow sufficient to raise the float within the channel is present or not. This indication may be used to determine whether the flow line delivers a sufficient flow of a cooling fluid, for example water, to a cooling device connectable to an electronic device for maintaining a safe operating temperature of the electronic device.

With these fundamentals in place, we will now consider some non-limiting examples to illustrate various implementations of aspects of the present technology.

In one such non-limiting example, the flow detection device is used to monitor the presence of a sufficient cooling flow in each component inserted in a rack. FIG. 1 is a front perspective view of a system 100 comprising a rack 102 and at least one insertable component 104 in accordance with an embodiment of the present technology. The component 104 includes a liquid adaptor 106 adapted for mating with a liquid connector 108 mounted on a backplane 110 of the rack 102. The component 104 also includes a main board 112.

As shown on FIG. 1, the rack 102 comprises a plurality of vertically distributed rack stages 114. Each rack stage 114 is adapted to receive a distinct component such as the component 104. The main board 112 may be a standard-size board, for example a 19-inch board. Each rack stage 114, or position, may occupy a standard-size rack unit "U". A height of the shown component 104 is adapted to fit in a single rack stage, the height of the component 104 not exceeding the unit U. Each rack stage 114 is adapted to receive a distinct component when each of those components has a height that does not exceed the rack unit U. Another component 116 occupies a plurality rack stages 114 when inserted in the rack 102.

Figure 2:
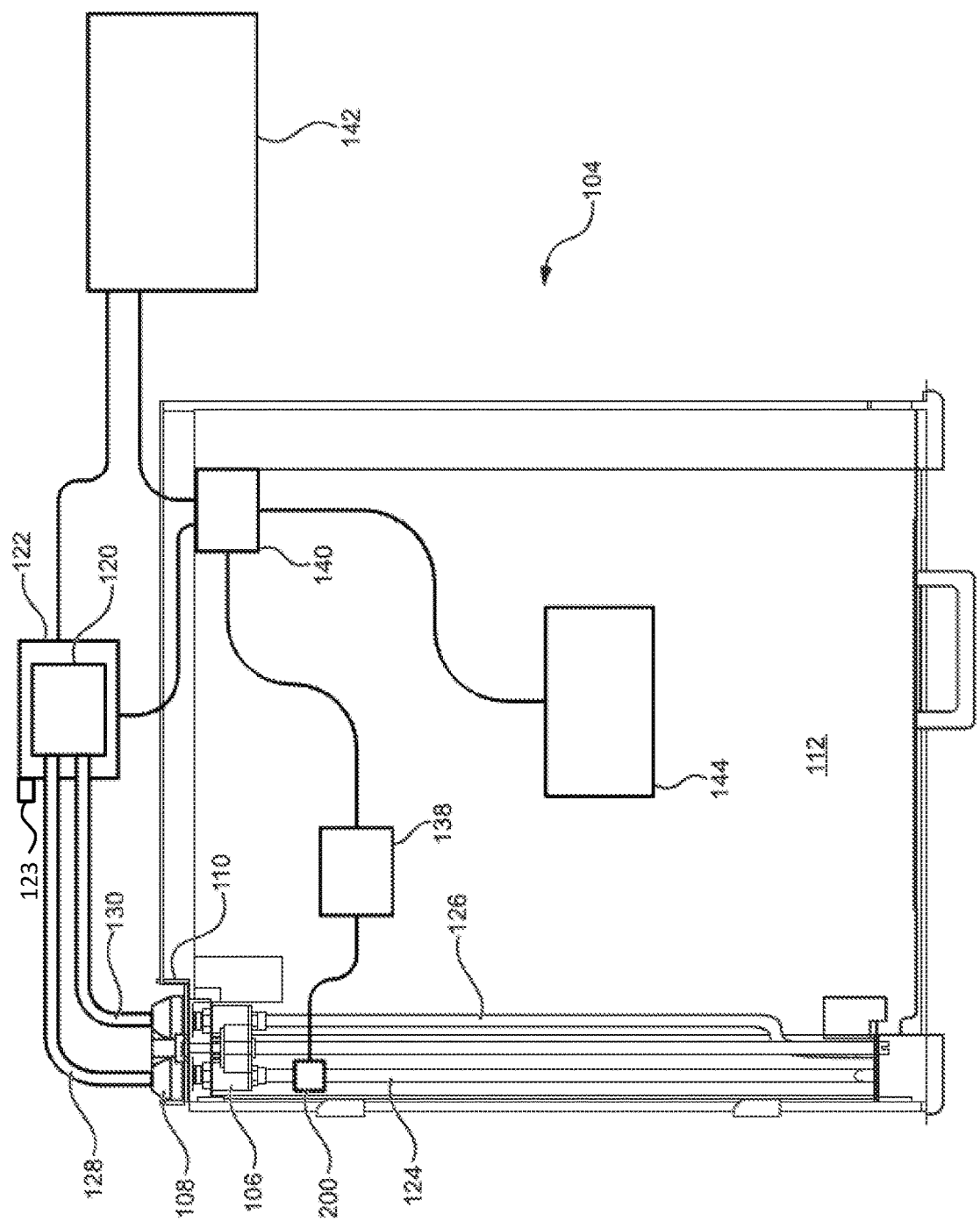
FIG. 2 is a top plan view of a component insertable in the rack of FIG. 1, the component providing a fluidic connection for cooling purposes in accordance with an embodiment of the present technology.

FIG. 2 is a top plan view of the component 104 insertable in the rack 102 of FIG. 1, the component 104 providing a fluidic connection for cooling purposes in accordance with an embodiment of the present technology. Each rack stage 114 comprises a cooling arrangement including a cooling fluid circuit and a processor. The cooling fluid circuit includes a fluidic input line and a fluidic output line for circulating a cooling fluid in a cooling device 120 mounted on an electronic device 122, for example a high-speed processor. The electronic device 122 may include, or be associated with, a temperature sensor 123 that continuously monitors the temperature of the electronic device 122. A "cold" feed tube 124 and a "hot" return tube 126 are mounted on the component 104, in front of the backplane 110. The cold feed tube 124 is connected via the liquid adaptor 106 and the liquid connector 108 to a "cold" inlet tube 128 located behind the backplane 110, the cold feed tube 124 and the cold inlet tube 128 together forming the fluidic input line of the cooling fluid circuit when the component 104 is received in the rack 102. The hot return tube 126 is connected via the liquid adaptor 106 and the liquid connector 108 to a "hot" outlet tube 130 located behind the backplane 110, the hot return tube 126 and the hot outlet tube 130 together forming the fluidic output line.

The fluidic input line receives a cold fluid from a cooling fluid source (not shown) and the fluidic output line returns the fluid, which has been heated in the cooling device 120, toward a drain (not shown). It should be noted that, on FIG. 2, the fluidic input and output lines (including their components) may be interchanged.

A flow detection device 200 is used in each rack stage 114 to monitor a flow of cooling fluid delivered to and/or returned from the cooling devices 120. On FIG. 2, the flow detection device 200 is shown connected to the cold feed tube 124. The flow detection device 200 may also be connected to the hot return tube 126. Alternatively, the flow detection device may be positioned behind the backplane 110, being connected to the cold inlet tube 128 or to the hot outlet tube 130. Given that the cold feed tube 124, the cold inlet tube 128, the hot outlet tube 130 and the hot return tube 126 are all part of the cooling fluid circuit that also includes the cooling device 120, the flow detection device 200 may monitor the flow of cooling fluid delivered to and/or returned from the cooling device 120 in any position within the cooling fluid circuit.

Figure 3:
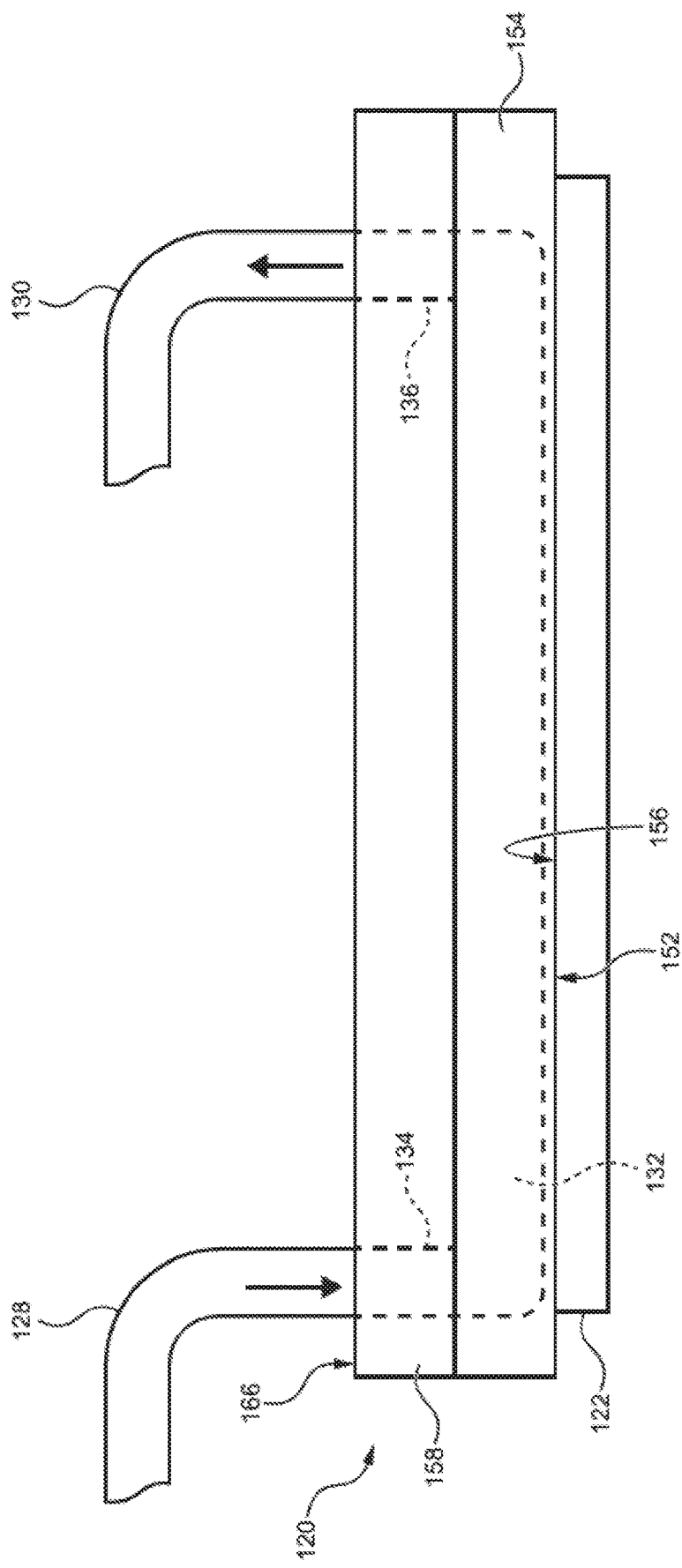
FIG. 3 is a right side elevation view of the cooling device of FIG. 2 coupled to an electronic device in accordance with an embodiment of the present technology.

The cooling device 120 is thermally coupled to the electronic device 122 for cooling thereof. As shown in FIG. 3, the cooling device 120 includes a base 154 having an external thermal transfer surface 152 (which is a lower surface of a base 154 of the cooling device 120) that is placed in contact with the electronic device 122. The thermal transfer surface 152 is placed in contact with an upper surface 156 of the electronic device 122 to absorb heat therefrom. In some cases, a thermal paste may be disposed between the thermal transfer surface 152 and the electronic device 122, applied to the thermal transfer surface 152 or the upper surface 156 of the electronic device 122, to improve heat transfer therebetween by ensuring continuity of contact between the thermal transfer surface 152 and the upper surface 156 of the electronic device 122. Any other medium with adequate thermal conductivity for ensuring continuity of contact between the thermal transfer surface 152 and the upper surface 156 of the electronic device 122 may be used instead of the thermal paste in other cases.

The cooling device 120 has one or more liquid channels 132 conveying the cooling fluid therethrough. More specifically, the liquid channels 132 are defined by joined surfaces of both the base 154 and a cover 158 of the cooling device 120. Notably, a continuous recess formed within the base 154 defines paths that form the liquid channels 132.

The liquid channels 132 are thermally coupled to the thermal transfer surface 152 such that, when the cooling fluid flows in the liquid channels 132, heat absorbed by the thermal transfer surface 152 is subsequently absorbed by the cooling fluid flowing in the liquid channels 132. The cooling fluid is received into the liquid channels 132 via an inlet port 134 and expelled therefrom via an outlet port 136. Both the inlet port 134 and the outlet port 136 are defined in the cover 158 (i.e., the cooling fluid enters and exits the cooling device 120 via the cover 158). Referring to FIGS. 2 and 3, the inlet port 134 is fluidly connected to the cold inlet tube 128 through which the cooling fluid is fed into the liquid channels 132. Similarly, the hot outlet tube 130 is fluidly connected to the outlet port 136 to discharge the cooling fluid from the liquid channels 132. In this embodiment, the inlet port 134 and the outlet port 136 are copper tubes and are welded to an outer surface 166 of the cover 158.

The liquid channels 132 describe paths from the inlet port 134 to the outlet port 136 such as to guide the flow of the cooling fluid along the path. As will be described in greater detail below, the particular paths described by the liquid channels 132 provide efficient cooling of the electronic device 122.

Figure 4:
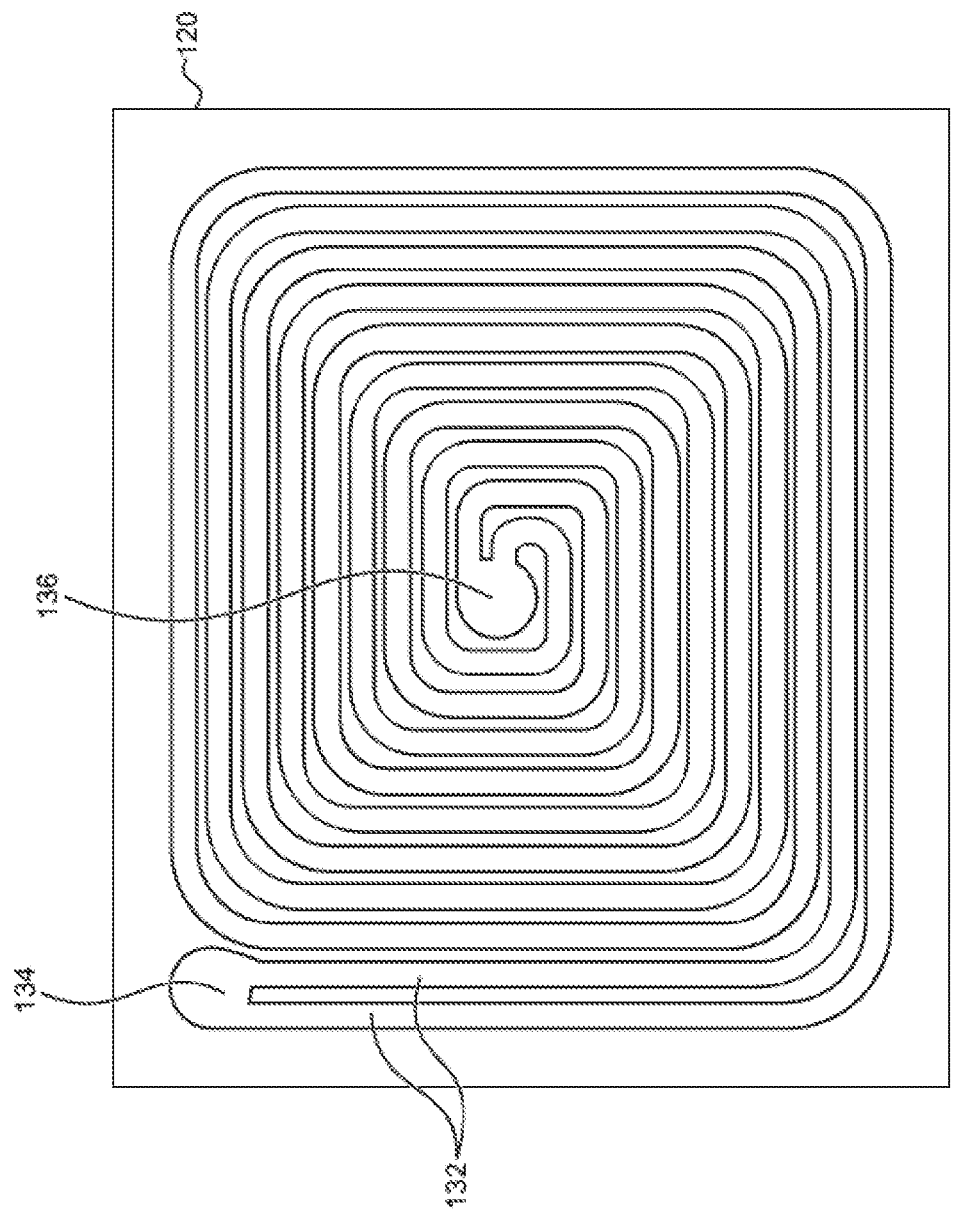
FIG. 4 is a top plan view of a cooling device in accordance with an embodiment of the present technology.

FIG. 4 is a top plan view of the cooling device 120 in accordance with an embodiment of the present technology. The cooling device 120 is adapted to be sealably mounted on the electronic device 122 so that the cooling fluid flowing within its liquid channels 132 receives heat from the electronic device 120. The cooling device 120 comprises two (2) ports 134, 136, one of which is used as an inlet connected to the fluidic input line (being connected to the cold inlet tube 128), the other port being used as an outlet connected to the fluidic output line (being connected to the hot outlet tube 130). In an embodiment, the ports 134 and 136 are interchangeable. The illustrated shape and number of the liquid channels 132 and the location of the ports 134, 136 as shown on FIG. 3 are for illustration purposes and do not limit the present disclosure, as other configurations are also contemplated.

Returning to FIG. 2, a processor 138 is mounted on the main board 112 of the component 104 and is in communication with the flow detection device 200. The processor 138 can determine a status of the flow of the cooling fluid in the flow detection 200 device based on a signal from a sensor (shown in a later Figure) of the flow detection device 200. As such, the processor 138 is operable to determine whether of a sufficient cooling flow is present in the cooling fluid circuit. The processor 138 is communicatively coupled to the electronic device 122 via a connector 140 mounted on the main board 112, at an edge of the main board 112 proximate to the backplane 110 of the rack 102. The processor 138 is also communicatively coupled to the temperature sensor 123, either directly or via the electronic device 122, and is thus informed of the temperature of the electronic device 122 on a continuous basis. In an embodiment, the processor 138 may be configured to cause a shutdown of the electronic device 122 when the status of the flow of the cooling fluid in the flow detection device 200 indicates a lack of cooling flow.

As illustrated, the flow detection device 200 and the processor 138 that communicates with the flow detection device 200 are mounted on the main board 112 of the component 104. Mounting one or both of the flow detection device 200 and/or the processor 138 behind the backplane 110 is also contemplated.

The rack 102 comprises a main processor 142 that is communicatively coupled to the electronic component 122. The main processor is also communicatively coupled to the processor 138, via the connector 140. Usually, another electronic component 144, for example a server, may be mounted on the main board 112 of the component 104 and is communicatively coupled to the electronic device 122 and to the main processor 142 via the connector 140.

The processor 138 can thus send the status of the flow of the cooling fluid in the cooling arrangement for the component 104 to the main processor 142. The main processor 142 may cause a transfer of operations running on the electronic device 122 coupled to the component 104 to another electronic device 122 mounted in another rack stage 114 or mounted to another rack 102 when the processor 138 reports that the status of the flow of the cooling fluid indicates a lack of cooling flow in the flow detection device 200. The main processor 142 may also issue a notification, for example an alarm, when the status of the flow of the cooling fluid for the component 104 indicates the lack of cooling flow.

Conversely, when the component 104 is inserted in a given rack stage 114, the processor 138 may report to the main processor 142 that a proper cooling flow is being delivered to the cooling device 120 mounted to the electronic device 122 present in that rack stage 114. The main processor 142 may cause a start of the electronic device 122 present in that rack stage 114 in response to the indication that the proper cooling flow is available. On an ongoing basis or upon being queried by an operator of the system 100, the main processor 142 may cause to display the status of the flow for each of the plurality of stages 114 in which components such as the component 104 are received.

FIG. 5a is a side elevation, schematic view of a flow detection device 200A in accordance with an embodiment of the present technology. FIG. 5b is a rear elevation, schematic view of the flow detection device 200A of FIG. 5a in accordance with an embodiment of the present technology. The flow detection device 200A comprises a fluidic input port 202, a fluidic output port 204, a channel 206 connected to the fluidic input port 202 and to the fluidic output port 204 and a float 208 located within the channel 206. A specific weight of the float 208 is greater than a specific weight of a fluid injected in the flow detection device 200A via the fluidic input port 202. In the absence of a flow, the float 208 tends to move down within the channel 206, assuming the position identified with the reference "A" on FIG. 5a. Respective locations of the fluidic input port 202, of the channel 206 and of the fluidic output port 204 on the flow detection device 200A cause the float 208 to rise within the channel 206, assuming the position identified with the reference "B" on FIG. 5a, when a sufficient flow of the fluid is injected in the flow detection device 200A. A sensor 210 is mounted on the flow detection device 200A and is adapted to detect a position of the float 208 within the channel 206. Lead wires 211 are connected to the sensor 210 to provide a status of a flow of fluid in the flow detection device 200A to a separate device, for example to the processor 138 of FIG. 2.

A specific gravity of the float 208 may be selected in view of a specific gravity of the fluid that is to be detected by the flow detection device 200A. With a low ratio of the specific gravity of the float 208 over the specific gravity of the fluid, for example a ratio of 1.2, a relatively weak flow of the fluid will suffice to cause the float 208 to rise in the channel 206. With a higher ratio, for example a ratio of 1.6, a stronger flow of the fluid will be necessary to cause the float 208 to rise in the channel. In an embodiment, the fluid to be measured is water, which has a specific gravity of 1.0, and the float 208 is made of polyoxymethylene, for example Delrin® from DuPont, which has a specific gravity of 1.42. In addition to its specific gravity, other parameters of the float 208 that may be tailored for a specific application include its composition, its size, its shape and its texture.

The fluidic input and output ports 202, 204 may be connected to fluidic lines that carry fluid to be monitored. As an example, Carstick® hydraulic fittings from Parker Hannifin may be mounted to a fluidic line and easily connected to the fluidic input and output ports 202, 204.

In the embodiment of FIGS. 5a and 5b, the sensor 210 of the flow detection device 200A comprises a magnetic sensor 220. The float 208 may comprise a magnetic material, for example a steel insert or steel powder, and a magnet 222 may be used to magnetize the magnetic material of the float 208. The magnetic sensor 220 can detect the position of the float 208 when the float 208 rises to the top of the channel 206. Alternatively, a magnet may be inserted in the float 208, in which case the magnetic sensor 220 can detect the position of the float 208 and the magnet 222 may be omitted.

Figure 6B:
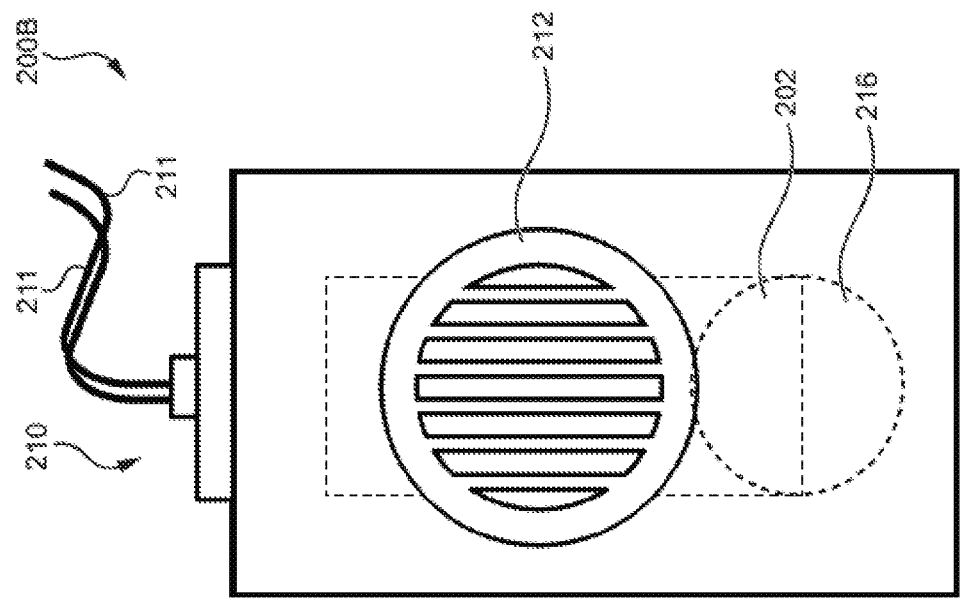
FIG. 6b is a rear elevation, schematic view of the flow detection device of FIG. 6a in accordance with an embodiment of the present technology.
Figure 6A:
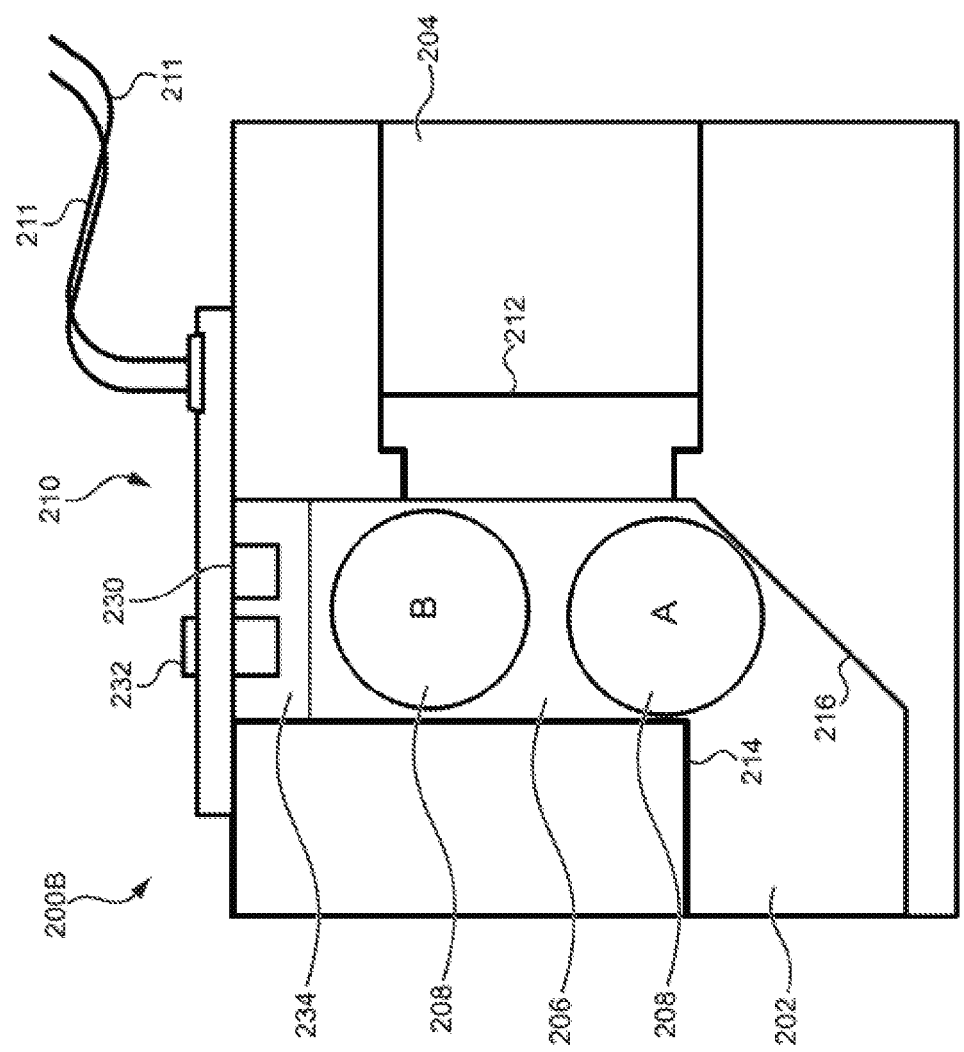
FIG. 6a is a side elevation, schematic view of another flow detection device in accordance with an embodiment of the present technology.

FIG. 6a is a side elevation, schematic view of another flow detection device 200B in accordance with an embodiment of the present technology. FIG. 6b is a rear elevation, schematic view of the flow detection device 200B of FIG. 6a in accordance with an embodiment of the present technology. The embodiment of the flow detection device 200B as shown on FIGS. 6a and 6b differs from the previous embodiment illustrated on FIGS. 5a and 5b in the nature of the sensor 210. In this embodiment, the sensor 210 comprises a light detector 230 and a light source 232 mounted on a transparent or translucent window 234 located in an upper area of the channel 206. The light source 232 emits light, for example a light emitting diode (LED) emitting infrared light, through the window 234. The light detector 230 detects light reflected by the float 208. Polyoxymethylene has a generally white color and provides for a good reflection of the light from the light source 232. In an embodiment, the light detector 230 is a QRE1113 sensor from ON Semiconductor and is adapted to detect infrared light. Although some reflected light may be detected in any position of the float 208 within the channel 206, a maximum level of light is detected when the float 208 is in a highest position within the channel 206.

In an embodiment, the light detector 230 may be configured to provide, via the lead wires 211, a binary indication that a sufficient flow of fluid is present, or not, within the flow detection device 200B. The flow of fluid is deemed "sufficient" when the float 208 rises at least to a predetermined position within the channel 206, this predetermined position being calculated according to the needs of a particular application. In another embodiment, the light detector 230 may provide an estimation of a level of the flow of the fluid within the flow detection device 200B as a function of a level of detected light reflected by the float 208, this level being indicative of a relative height of the float 208 within the channel 206.

As shown on FIGS. 5a and 6a, the channel 206 extends substantially vertically within the flow detection device 200A or 200B, being connected at its lower end to the fluidic input port 202 and at its upper end to the fluidic output port 204. An embodiment, in which the channel 206 extends upwardly from the fluidic input port 202 to the fluidic output port 204 at an angle from the vertical, is also contemplated. This angular configuration of the channel 206 extends the length of the channel 206 and provides for a finer measurement of the level of the flow of the fluid as a function of the position of the float 208 within the length of the channel 206 and further as a function of an angular relationship between a beam of light emitted by the light source 232, the channel 206 and the light detector 230.

Various techniques may be used to ensure that the float 208 will not escape from the channel 206. In the embodiments of FIGS. 5a and 6a, a grid 212 is placed between the channel 206 and the fluidic output port 204. The grid 212 places very little restriction of the flow of fluid through the flow detection device 200A or 200B while blocking the float 208 from exiting through the fluidic output port 204. A corner 214 is defined between the channel 206 and an upper edge of the fluidic input port 202. An angled ramp 216 is defined between the channel 206 and a lower edge of the fluidic input port 202. A constriction is defined between the corner 214 and the ramp 216 to block the float 208 from exiting through the fluidic input port 202. In these embodiments, the float 208 may be inserted in the flow detection device 200A or 200B via the fluidic output port 204 prior to the mounting of the grid 212 to the flow detection device 200A or 200B, also via the fluidic output port 204.

In another embodiment, the float 208 may have a diameter that is at least slightly smaller than a diameter of the channel 206 while being at least slightly larger than diameters of the fluidic input port 202 and of the fluidic output port 204. In this embodiment, insertion of the float 208 in the channel 206 may be done via an opening at the top of the flow detection device 200B, prior to the mounting of the window 234 and of the sensor 210 on the flow detection device 200.

FIG. 7 is a side elevation, schematic view of yet another flow detection device 200C in accordance with an embodiment of the present technology. The flow detection device 200C as shown on FIG. 7 includes the fluidic input port 202, the fluidic output port 204, the channel 206, the float 208, the sensor 210 and the lead wires 211 as previously described. In particular, the sensor 210 may comprise the magnetic sensor 220 or the light detector 230. The embodiment of the flow detection device 200C as shown on FIG. 7 further comprises a conduit 240 connecting the channel 206 to the fluidic output port 204. The conduit 240 extends from under a position of the float 208 when the float 208 is raised within the channel 206, as shown on FIG. 7. The conduit 240 may extend horizontally or may rise starting from the channel 206 so that the fluidic output port 204 is at least as high as the position of the float 208 when the float 208 is raised within the fluidic channel 206.

Air or some other gas may eventually penetrate within the flow detection device 200C. Any accumulation of gas near the top of the channel 206 might limit the extent to which the float 208 may rise within the channel 206. In order to facilitate the evacuation of any gas eventually found in the channel 206, a gas extraction passage 242 is provided to connect the channel 206 to the fluidic output port 204. An entry 244 of the gas extraction passage 242 is located at or above a highest position of the float 208 when the float 208 rises within the channel 206. An exit 246 of the gas extraction passage 242 is located proximate to the fluidic output port 204 while being at least as high as the entry 244 of the gas extraction passage 242 to allow gas eventually present in the channel 206 to be expelled via the fluidic output port 204.

Without necessarily being drawn to scale, FIG. 7 shows an embodiment of the flow detection device 200C in which the diameter of the float 208 is slightly smaller than a diameter of the channel 206 and at least slightly larger than diameters of the fluidic input port 202, or the fluidic output port 204 and of the conduit 240. It may also be observed that the float 208 is not necessarily spherical as illustrated on the various Figures. Likewise, the fluidic input port 202, the fluidic output port 204, the channel 206, the conduit 240 and the gas extraction passage 242 do not necessarily have circular cross-sections. Any opening through the flow detection device 200A, 200B or 200C may for example have an oval cross-section along at least a part of their respective lengths. Respective cross-sections of the fluidic input port 202 and of the fluidic output port 204 may be shaped, without being circular, to prevent the release of the float 208. A spherical float 208 could reside in a channel 206 having a square cross-section. Various shapes and configurations of the components of the flow detection devices 200A, 200B and 200C may be contemplated.

Any one of the above embodiments of the flow detection device 200A, 200B or 200C may be integrated as a part of the cooling arrangements that are part of the system 100 of previous Figures, the lead wires 211 of the flow detection device 200A, 200B or 200C being connected to the processor 138 to provide an indication of the flow of a fluid, in particular a cooling fluid, through as detected by the sensor 210. Owing to its simple construction, the flow detection device 200A, 200B or 200C is very inexpensive to manufacture and occupies a modest portion of the limited available space in the rack 102. While some embodiments of the flow detection device 200A, 200B or 200C may be configured to provide a fine measurement of the level of the flow of the fluid as a function of the position of the float 208 within the length of the channel 206, simpler embodiments may be configured to provide a binary indication that the flow of cooling fluid passing through the cooling device 120 is sufficient, or not, to properly cool the electronic device 122. The size and geometry of the fluidic input port 202, the fluidic output port 204, the channel 206 and the float 208 and the specific weight of the material selected for constructing the float 208 may be calculated and/or chosen via simple testing to provide this binary indication based on given flow levels for the cooling fluid.

In the cooling arrangement of FIG. 2, the cooling device 120 is a primary cooling device adapted to receive the cooling fluid from the fluidic input line 124, 128 and to transfer heat from the electronic device 122 to the cooling fluid before returning the cooling fluid via the fluidic output line 130 and 126 during normal operation of the system 100. Fluid cooling technology is very efficient in absorbing the heat generated by the electronic device 122. Fluid cooling consumes little energy and can be centrally controlled for the rack 102 and for the entire system 100. However, the cooling device 120 and/or the fluidic input and output lines may eventually become blocked due, for instance, to the accumulation of impurities that may present in the cooling fluid. Other causes for a lack of cooling fluid in the cooling device 120 may lie outside of the component 104. In the present technology, the cooling device 120 is supplemented with a secondary cooling device in order to prevent a rapid overheating and eventual failure of the electronic device 122 when a lack of flow of the cooling fluid in the cooling device 120 is detected.

The cooling device 120 is expected to provide sufficient cooling in most circumstances. Hence, incorporating in the rack 102 a fully redundant secondary fluid cooling system would be excessively costly and would occupy an excessive amount of space with in the rack 102. On the other hand, the secondary cooling device may need to be activated very rapidly in case of a lack of cooling fluid flow in the cooling device 120. Additionally, at least in some embodiments, the secondary cooling device may need to be activated for a brief period of time until the problems having caused the lack of flow of the cooling fluid in the cooling device 120 are solved by maintenance personnel or until the electronic device 122 can be properly shut down after having transferred its functions to another electronic device. Although the secondary cooling device may consume some more electrical power than the cooling device 120, this extraneous power consumption is expected to have a negligible impact on the total power consumption of the system 100 given the infrequent use of the secondary cooling device. Given these constraints, the secondary cooling device is structurally distinct from the primary cooling device at least in that it consume electrical power, it does not include a cooling fluid circuit, it may be used infrequently and for short periods of time without requiring long-term heat absorption and dissipation capabilities, and in that it can be electrically activated.

Figure 8:
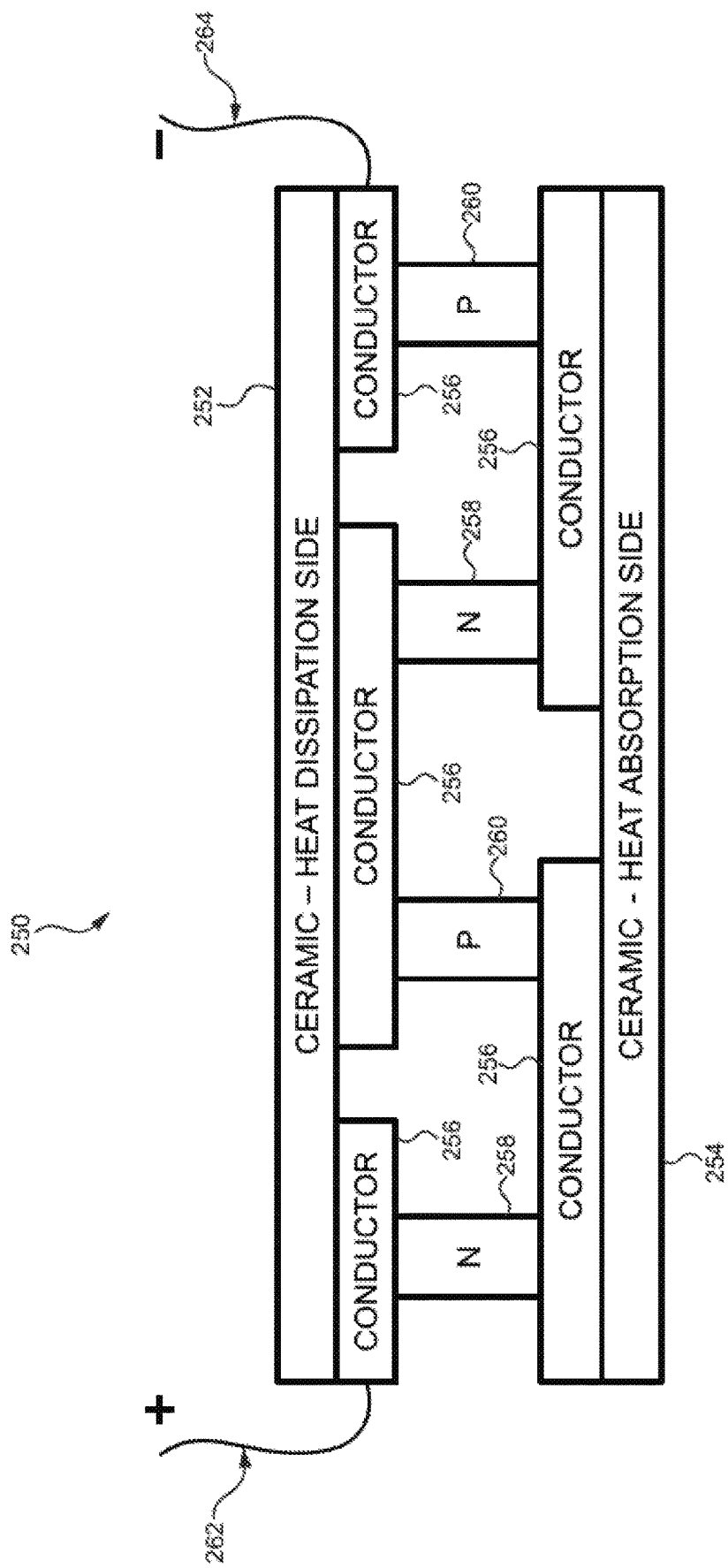
FIG. 8 is a schematic view of a thermoelectric cooling element.

FIG. 8 is a schematic view of a thermoelectric cooling element. A thermoelectric cooling element 250, also called a "Peltier device", may be used as a secondary cooling device for the electronic device 122. The thermoelectric cooling element 250 comprises opposite ceramic plates 252 and 254 and series of conductors 256 applied on internal faces of the ceramic plates 252 and 254. Alternating n-type junctions 258 and p-type junctions 260 are inserted between the conductors 256 on opposite sides of the thermoelectric cooling element 250 and form chains in which a first conductor 256 is connected to a second conductor 256 via an n-type junction 258 and the second conductor 256 is connected to a third conductor 256 via a p-type junction 260, and so on. Although small numbers of the conductors 256, the n-type junctions 258 and the p-type junctions 260 are illustrated, a typical thermoelectric cooling element 250 may include many more n-type junctions 258 and p-type junctions 260 linking a larger number of conductors 256. Longer chains may be formed and plurality of parallel chains may be formed between the ceramic plates 252 and 254.

The ceramic plate 254 is a heat absorption plate. It can be applied on the surface of an element that requires cooling. The ceramic plate 252 is a heat dissipation plate. Electrical leads 262 and 264 are respectively connected to positive (+) and negative (−) voltage sources. The electrical lead 262 is connected to a conductor 256 that is itself connected to an n-type junction 258. The electrical lead 264 is connected to another conductor 256 that is itself connected to a p-type junction 260. Polarizing the thermoelectric cooling element 250 in this manner allows the transfer of heat from the heat absorption plate 254 to the heat dissipation plate 252.

Figure 9:
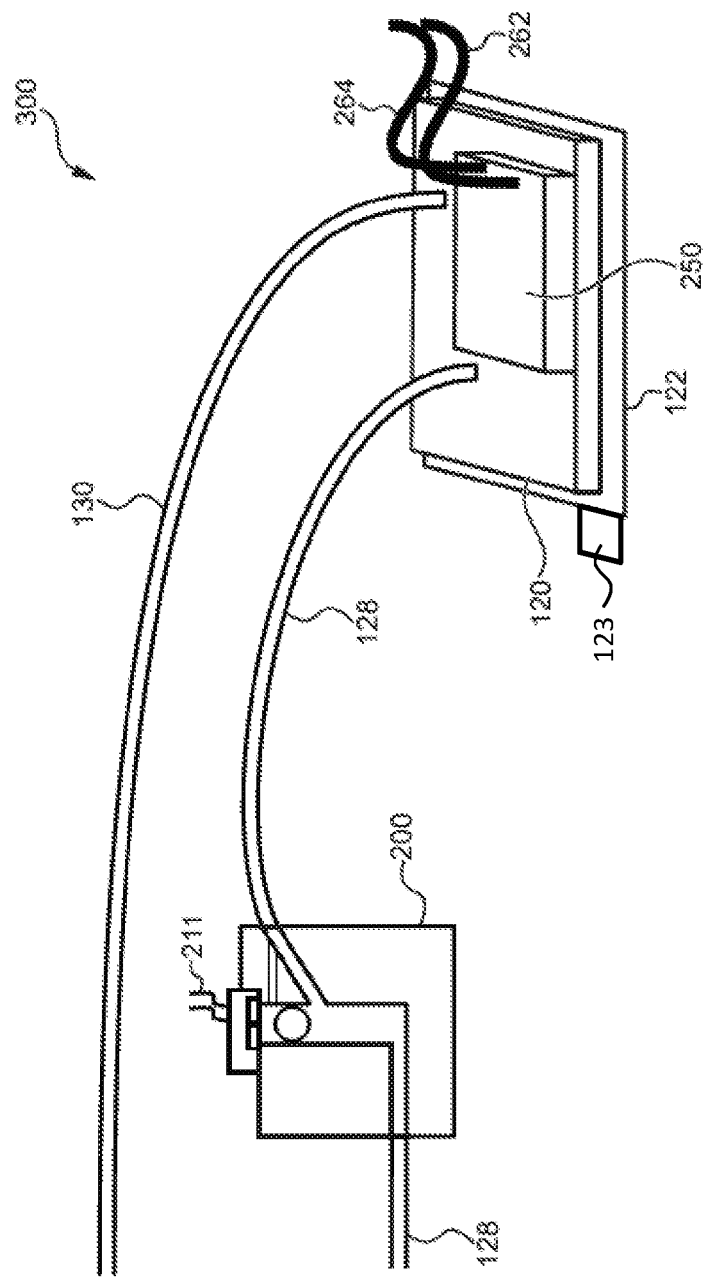
FIG. 9 is a simplified block diagram of a first cooling arrangement in accordance with an embodiment of the present technology.

FIG. 9 is a simplified block diagram of a first cooling arrangement 300 in accordance with an embodiment of the present technology. The cooling arrangement comprises a cooling fluid circuit that includes the cold inlet tube 128, which is a part of a fluidic input line adapted for receiving a cooling fluid from the cooling fluid source. The cooling fluid circuit also includes the hot outlet tube 130, which is a part of a fluidic output line adapted for returning the cooling fluid toward the drain. The cooling device 120 is a primary cooling device for the cooling fluid circuit of FIG. 9. As expressed earlier, the cooling device 120 is adapted to be thermally connected to the electronic device 122, being for example mounted on the electronic device 122. The cooling device 120 receives the cooling fluid from the fluidic input line via the cold inlet tube 128 and transfers heat from the electronic device 122 to the cooling fluid before returning the cooling fluid via the hot outlet tube 130 of the fluidic output line. The flow detection device 200 (e.g. any embodiment 200A, 200B or 200C of the flow detection device 200) is operable to monitor a flow of the cooling fluid in the cooling fluid circuit. The flow detection device 200 may detect a lack of flow of the cooling fluid in the cooling fluid circuit, indicative of a lack of flow of the cooling fluid in the cooling device 200. The lack of flow may be understood as a complete lack of circulation of the cooling fluid in the cooling fluid circuit or as a reduction of the circulation of the cooling fluid below a predetermined flow. The flow detection device 200 reports the status of the flow of the cooling fluid in the flow detection to the processor 138 via the lead wires 211.

In the example of FIG. 9, the secondary cooling device comprises a heat sink in the form of a thermoelectric cooling element 250 that is mounted on the electronic device 122 and is thus thermally connected to the electronic device 122. The thermoelectric cooling element 250 is operable to absorb and dissipate heat from the electronic device 122 when the flow detection device 200 detects the lack of flow of the cooling fluid in the cooling device 120. To this end, the processor 138 activates the thermoelectric cooling element 250 when receiving the lack of flow indication from the flow detection device 200 by causing the thermoelectric cooling element 250 to be energized via the electrical leads 262 and 264.

Figure 10:
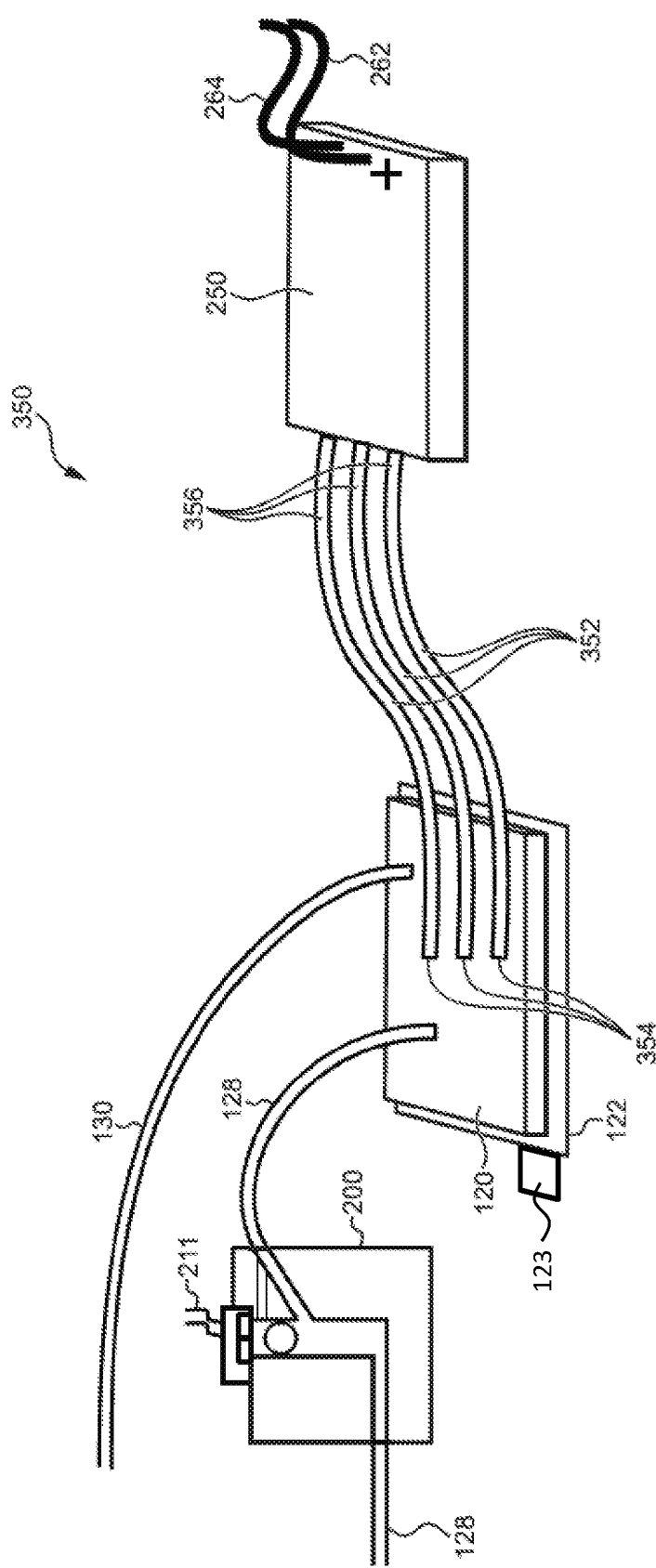
FIG. 10 is a simplified block diagram of a second cooling arrangement in accordance with an embodiment of the present technology.

FIG. 10 is a simplified block diagram of a second cooling arrangement 350 in accordance with an embodiment of the present technology. The cooling arrangement 350 includes the same cooling fluid circuit as introduced in the description of the cooling arrangement 300 of FIG. 9. In this embodiment, the heat sink of the secondary cooling device is the thermoelectric cooling element 250, which is thermally connected to the electronic device 122 via one or more heat pipes 352 (three (3) are shown in the non-limiting example of FIG. 10). The heat pipes 352 have evaporator portions 354 thermally connected to the electronic device 122, being mounted on the cooling device 120 in the example of FIG. 10. The heat pipes 352 have condenser portions 356 that are thermally connected to the thermoelectric cooling element 250 in the cooling arrangement 350. As in the cooling arrangement 300, the thermoelectric cooling element 250 is operable to absorb and dissipate heat, transported from the electronic device 122 to the thermoelectric cooling element 250 via the heat pipes 352, when the flow detection device 200 detects the lack of flow of the cooling fluid in the cooling device 120. To this end, the processor 138 activates the thermoelectric cooling element 250 when receiving the lack of flow indication from the flow detection device 200 by causing the thermoelectric cooling element 250 to be energized via the electrical leads 262 and 264. Comparing the cooling arrangements 300 and 350, the use of the heat pipes 352 to provide the thermal connection between the electronic device 122 and the thermoelectric cooling element 250 allows the heat generated by the electronic device 122 to be dissipated further from the electronic device 122 within the rack 102.

Figure 11:
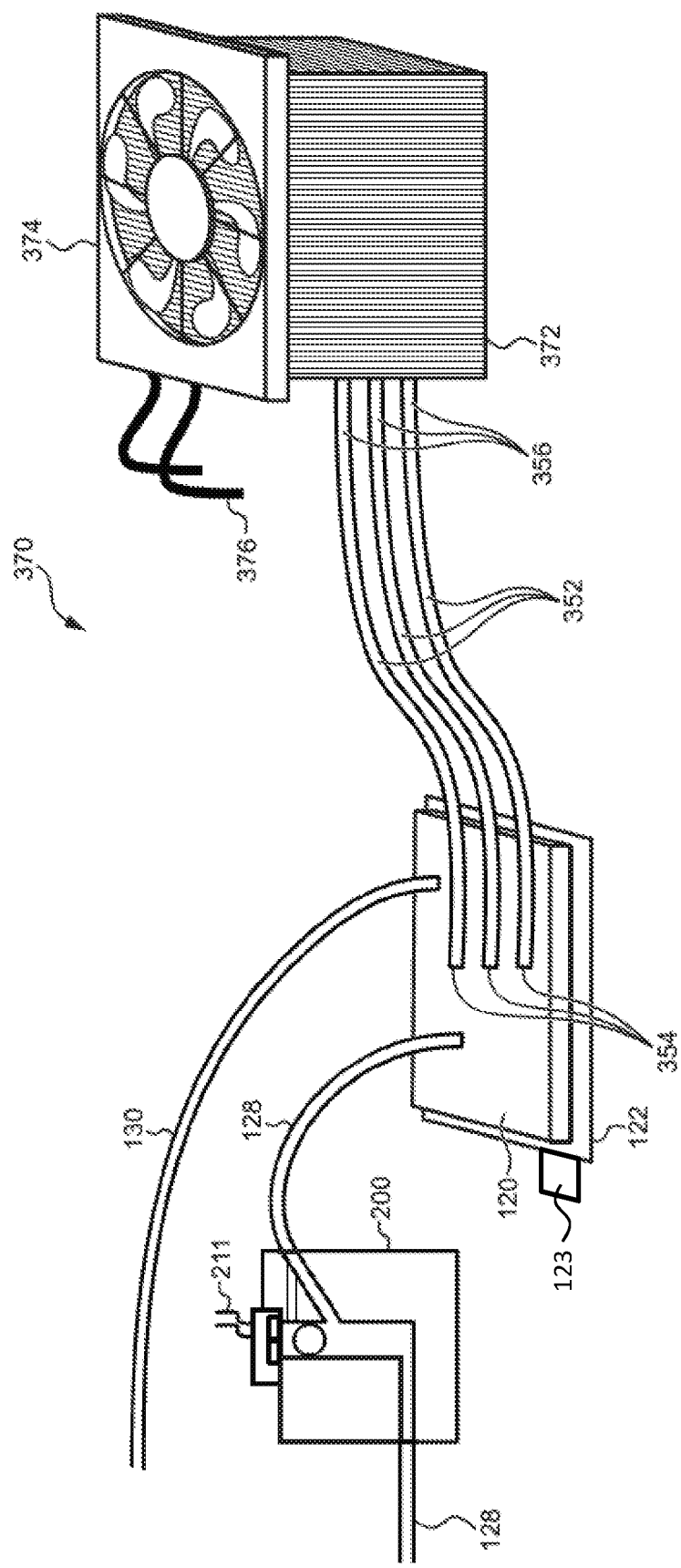
FIG. 11 is a simplified block diagram of a third cooling arrangement in accordance with an embodiment of the present technology.

The thermoelectric cooling element 250 as used in FIGS. 9 and 10 can be activated very rapidly but its heat absorption capabilities may be quite limited. FIG. 11 is a simplified block diagram of a third cooling arrangement 370 in accordance with an embodiment of the present technology. The cooling arrangement 370 includes the same cooling fluid circuit as introduced in the description of the cooling arrangements 300 and 350. The cooling arrangement 370 also comprises the same heat pipes 352 as introduced in the description of FIG. 10. The evaporator portions 354 of the heat pipes 352 are thermally connected to the electronic device 122, being mounted on the cooling device 120 in the example of FIG. 11. The condenser portions 356 of the heat pipes 352 are thermally connected to a heat sink, which in the case of the cooling arrangement 370 is a radiator 372 operable to absorb and dissipate heat, transported from the electronic device 122 to the radiator 372 via the heat pipes 352, when the flow detection device 200 detects the lack of flow of the cooling fluid in the cooling device 120. To this end, the processor 138 activates a fan 374 mounted to the radiator 372 to provide forced air cooling to the radiator 372 when receiving the lack of flow indication from the flow detection device 200. The fan 374 is energized, or caused to be energized, by the processor 138 via lead wires 376 of the fan 374. In at least some embodiments, the combination of the radiator 372 with the fan 374 provides more heat dissipation capabilities than that of the thermoelectric cooling element 250 of earlier Figures to allow operating the electronic device 122 for a longer period without liquid cooling.

For enhanced cooling capability, the heat sink of FIG. 10, embodied as the thermoelectric cooling element 250 and the heat sink of FIG. 11, embodied as the combination of the radiator 372 with the fan 374, may be combined in a same cooling arrangement. It is contemplated that the condenser portions 356 of the heat pipes 352 could be connected to the thermoelectric cooling element 250, that the radiator 372 could be mounted on the thermoelectric cooling element 250 and that the fan 374 could be mounted on top of the radiator 372.

Returning to FIG. 2, in addition to using any one of the cooling arrangements 300, 350 or 370, the processor 138 may cause a shutdown of the electronic device 122 in response to receiving the lack of flow indication from the flow detection device 200. In such case, the secondary cooling element, whether embodied as the thermoelectric cooling element 250 or as the radiator 372 and the fan 374, may only be activated for a brief period in order to prevent overheating of the electronic device 122 while it is being shutdown. Direct control by the processor 138 allows a very rapid shutdown process for the electronic device 122. The cooling arrangement 300, 350 or 370 may be dimensioned with a relatively low heat dissipation capacity.

Alternatively, while the cooling arrangement 300, 350 or 370 is activated, the processor 138 may concurrently send a fault signal to a remote processor, for example the main processor 142 of the rack 102, when receiving the lack of flow indication from the flow detection device 200. The processor 138 may cause a shutdown of the electronic device 122 in response to receiving a shutdown command from the main processor 142. In an embodiment, prior to sending the shutdown command, the main processor 142 fetches operational information, indicative of functions and data being processed by the electronic device 122, from the electronic device 122 in response to receiving the fault signal. The main processor 142 transfers the fetched operational information to another electronic device 122. In this embodiment, the main processor 142 forwards the shutdown command to the processor 138 once the transfer of the fetched operational information to the other electronic device is completed. In such case, the secondary cooling element, whether embodied as the thermoelectric cooling element 250 or as the radiator 372 and the fan 374, may be activated for a somewhat longer period in order to prevent overheating of the electronic device 122 while its functions and data are being transferred under control of the main processor 142. In contrast with the direct control of the shutdown of the electronic device 122 by the processor 138, this more controlled shutdown process of the electronic device 122 by the main processor 142 may benefit from a somewhat increased dissipation capacity of the cooling arrangement 300, 350 or 370.

An operator may receive information about various operational parameters of the system 100 on a user interface (not shown) communicatively connected to the main processor 142. Some of these operational parameters may include a current temperature of the electronic device 122, a current status of the flow of coolant in the cooling device 120, a turned on/off status of the electronic device 122, and the like. Alternatively or in addition, messages may be displayed on the user interface to request corrective actions by the operator, for example when a lack of coolant flow is detected in the cooling device 120.

Figure 12:
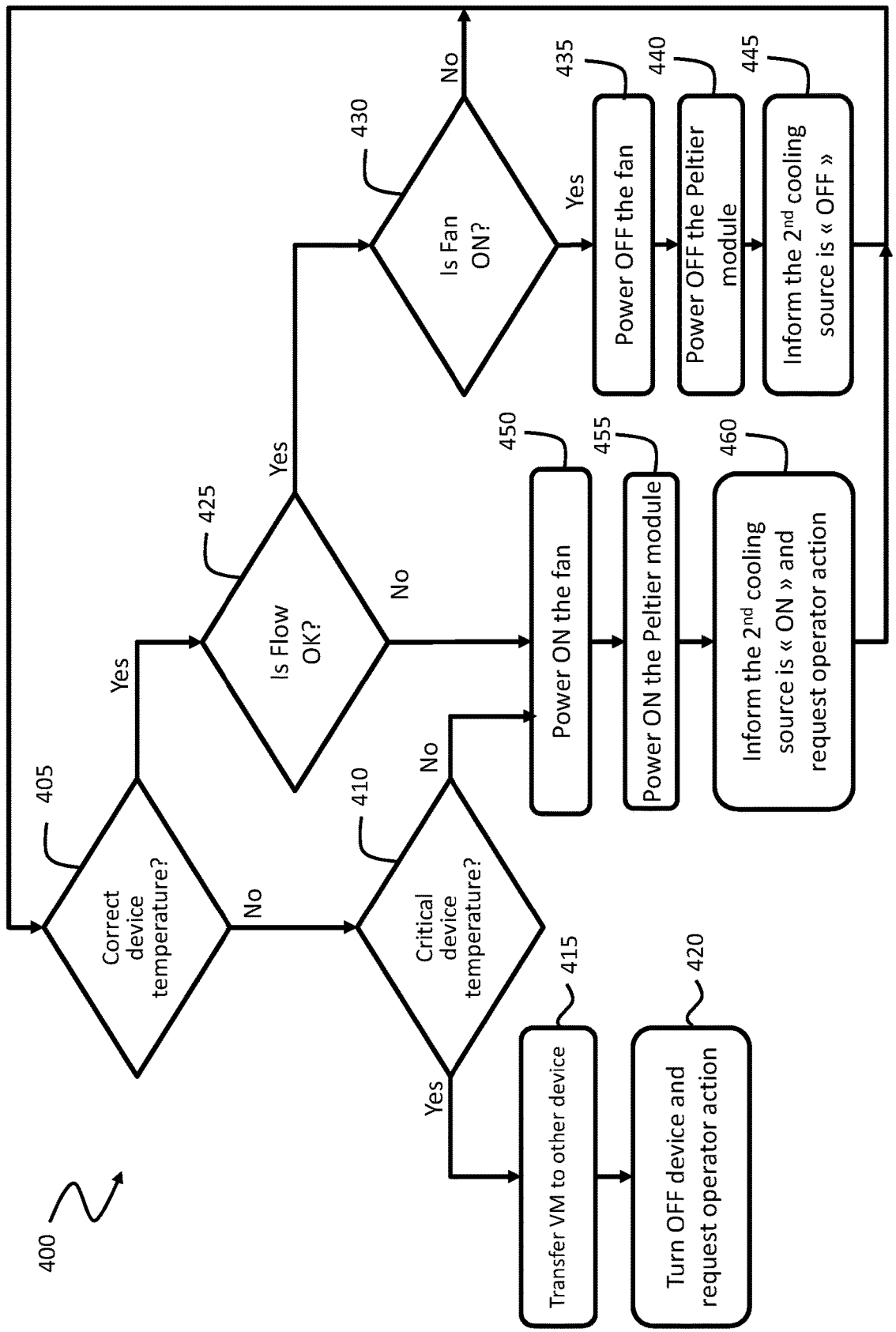
FIG. 12 is a flowchart showing operations of a method for protecting an electronic device against overheating in accordance with an embodiment of the present technology.

FIG. 12 is a flowchart showing operations of a method for protecting an electronic device against overheating in accordance with an embodiment of the present technology. On FIG. 12, a sequence 400 comprises a plurality of operations, some of which may be executed in variable order, some of the operations possibly being executed concurrently, some of the operations being optional. Operations of the sequence 400 are performed in part by actions of the temperature sensor 123, the processor 138, the main processor 142, the fan 374 and the thermoelectric cooling element 250. The temperature sensor 123 continuously monitors a temperature of the electronic device 122 and informs the processor 138 at operation 405. If the temperature of the electronic device 122 is found to exceed a normal temperature level (device temperature is deemed "not correct" at operation 405), the sequence 400 continues at operation 410 where the processor 138 compares the temperature of the electronic device 122 to a critical temperature threshold. If the critical temperature threshold is met or exceeded at operation 410, the sequence 400 continues at operation 415 in which the processor 138 informs the main processor 142 of the critical temperature condition and the main processor 142 initiates a transfer of data and operations that were until now handled by the electronic device 122 (e.g. a virtual machine (VM) hosted by the electronic device 122) to another device, following which the electronic device 122 is turned off and an indication is provided on a user interface (not shown) of the system 100 to request an operator to initiate a corrective action at operation 420.

If operation 410 shows that the temperature of the electronic device 122 has not reached the critical temperature threshold, the sequence 400 continues at operation 450, which is described in the following paragraphs.

Returning to operation 405, if the temperature of the electronic device 122 is found to not exceed a normal temperature level (device temperature is deemed "correct" at operation 405), the sequence 400 continues at operation 425 where the flow detection device 200 monitors the flow of the cooling fluid in the cooling fluid circuit that includes the cooling device 120. At operation 425, if the flow detection device 200 detects that a normal flow is not present in the cooling device 120, the sequence 400 continues at operation 450, which is described in the following paragraphs. On the other hand, if the flow detection device 200 detects that a normal flow is present in the cooling device 120, the processor 138 verifies the current status of the fan 374 at operation 430. If the fan 374 is currently turned off, the sequence 400 continues at operation 405 and the temperature sensor 123 continues monitoring the temperature of the electronic device 122 and informing the processor 138 of the temperature.

The processor 138 may determine that the fan 374 is currently turned on at operation 430. Given that operation 430 follows a determination at operation 405 that the temperature of the electronic device 122 is normal and a determination at operation 425 that the flow of coolant in the cooling device 120 is normal, this determination may be the result of corrective actions that have led to returning the temperature of the electronic device 122 to its normal range and/or returning of a normal flow of coolant in the cooling device. Regardless of the conditions may have led to determining at operation 430 that the fan 374 is currently turned on, the fan 374 is powered off at operation 435. If present, the thermoelectric cooling element 250 (e.g. a Peltier device) is turned off at operation 440. An indication may be provided at operation 445 on the user interface of the system 100 to indicate that the secondary cooling device, i.e. the fan 374 and/or the thermoelectric cooling element 250 are now turned off. The sequence 400 then returns to operation 405 for continued monitoring of the temperature of the electronic device 122.

Operation 450 may follow a detection that the temperature of the electronic device 122, while higher than the normal range (operation 405) is still lower than the critical level (operation 410). Operation 450 may also follow a determination that detects that a normal flow is not present in the cooling device 120 (operation 425). Regardless, the fan 374 is powered on at operation 450. The thermoelectric cooling element 250, if present, is turned on at operation 455. An indication may be provided at operation 460 on the user interface of the system 100 to indicate that the secondary cooling device, i.e. the fan 374 and/or the thermoelectric cooling element 250 are now turned on and to request the operator to initiate a corrective action. The sequence 400 then returns to operation 405 for continued monitoring of the temperature of the electronic device 122. In an embodiment, operation of the fan 374 and/or operation of the thermoelectric cooling element 250 may suffice to maintain the temperature of the electronic device 122 below the critical temperature threshold over a continued period. In another embodiment, the cooling arrangement 300, 350 or 370 may not have a sufficient heat absorption and dissipation capacity to maintain the temperature of the electronic device 122 below the critical temperature threshold over the long term. In the latter case, if a corrective action is not timely performed by the operator, operation 410 may eventually detect that the temperature of the electronic device 122 has reached the critical temperature threshold, following which the electronic device 122 may be turned off at operation 420.

Variants of the sequence 400 may be contemplated. In a non-limiting example, operation 460 may include transferring data and operations that were until now handled by the electronic device 122 to another device, as in operation 415, this transfer being performed before detecting that the temperature of the electronic device 122 has reached the critical temperature threshold.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

It should be expressly understood that not all technical effects mentioned herein need to be enjoyed in each and every embodiment of the present technology.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A cooling arrangement for an electronic device, comprising:

a cooling fluid circuit including a series combination comprising a fluidic input line, a fluidic output line, a primary cooling device and a flow detection device, wherein:
the fluidic input line is adapted for receiving a cooling fluid from a cooling fluid source,
the fluidic output line is adapted for returning the cooling fluid toward a drain,
the primary cooling device is adapted to be mounted on the electronic device so that the primary cooling device is thermally connected to the electronic device, the primary cooling device being further adapted to receive the cooling fluid from the fluidic input line and to transfer heat from the electronic device to the cooling fluid before returning the cooling fluid via the fluidic output line,
the flow detection device is mounted in one of the fluidic input line or the fluidic output line, and
the flow detection device is operable to detect a reduction or stoppage of a flow of the cooling fluid in the fluidic input line, in the primary cooling device and in the fluidic output line;
a secondary cooling device adapted to be thermally connected to the electronic device and operable to absorb and dissipate heat from the electronic device; and
a processor operatively connected to the flow detection device and to the secondary cooling device, the processor being configured to cause an activation of the secondary cooling device in response to receiving, from the flow detection device, an indication of a lack of flow of the cooling fluid in the primary cooling device.

2. The cooling arrangement of claim 1, wherein the secondary cooling device comprises at least one heat pipe having an evaporator portion adapted to be thermally connected to the electronic device and a condenser portion thermally connected to a heat sink.

3. The cooling arrangement of claim 2, wherein the evaporator portion of the at least one heat pipe is adapted to be mounted on the primary cooling device.

4. The cooling arrangement of claim 2, wherein the heat sink comprises a thermoelectric cooling element activable by the processor.

5. The cooling arrangement of claim 2, wherein the heat sink comprises:
a radiator; and
an electric fan activable by the processor and configured to provide forced air cooling to the radiator.

6. The cooling arrangement of claim 1, wherein the secondary cooling device comprises a thermoelectric cooling element activable by the processor and adapted to be thermally connected to the primary cooling device.

7. The cooling arrangement of claim 6, wherein the thermoelectric cooling element is adapted to be mounted on the primary cooling device.

8. The cooling arrangement of claim 1, wherein:
the processor is operatively connected to the electronic device; and
the processor is further configured to cause a shutdown of the electronic device in response to receiving the lack of flow indication from the flow detection device.

9. The cooling arrangement of claim 1, wherein:
the processor is operatively connected to the electronic device; and
the processor is further configured to:

transmit a fault signal toward a remote processor when receiving the lack of flow indication from the flow detection device, receive a shutdown command from the remote processor, and cause a shutdown of the electronic device in response to receiving the shutdown command.

10. The cooling arrangement of claim 1, further comprising a main processor communicatively coupled to the processor and to the electronic device, wherein, in operation:

the processor transmits a fault signal toward the main processor when receiving the lack of flow indication from the flow detection device;

the main processor fetches operational information from the electronic device in response to receiving the fault signal;

the main processor transfers the fetched operational information to another electronic device;

after transferring the fetched operational information to the other electronic device, the main processor forwards a shutdown command to the processor; and the processor causes a shutdown of the electronic device in response to receiving the shutdown command.

11. The cooling arrangement of claim 1, wherein:

the flow detection device is configured to provide an indication of a normal cooling fluid flow in the cooling fluid circuit; and the processor is further configured to cause a start of the electronic device in response to receiving the indication of the normal cooling fluid flow from the flow detection device.

12. A method for cooling an electronic device, the method comprising:

mounting a primary cooling device on the electronic device so that the primary cooling device is thermally connected to the electronic device;

providing a flow of a cooling fluid in a cooling fluid circuit fluidly connected to a series combination comprising the primary cooling device, a fluidic input line, a fluidic output line, and the primary cooling device;

detecting a reduction or a stoppage of the flow of the cooling fluid in the fluidic input line, in the primary cooling device and in the fluidic output line; and activating a secondary cooling device in response to detecting the reduction or the stoppage of the flow of the cooling fluid in the fluidic input line, in the primary cooling device and in the fluidic output line.

13. The cooling arrangement of claim 1, wherein:

the primary cooling device has a first cooling capacity; and the secondary cooling device has a second cooling capacity that is less than the first cooling capacity.

14. The cooling arrangement of claim 2, wherein the heat sink is physically separated from the electronic device by a length of the at least one heat pipe.

15. The cooling arrangement of claim 1, wherein the cooling fluid is in a liquid state throughout the cooling fluid circuit.

16. The method of claim 12, wherein the cooling fluid is in a liquid state throughout the cooling fluid circuit.

17. The method of claim 12, further comprising:

detecting a normal cooling fluid flow in the cooling fluid circuit; and causing a start of the electronic device in response to detecting the normal cooling fluid flow in the cooling fluid circuit.

18. The method of claim 12, further comprising:

monitoring a temperature of the electronic device; and activating the secondary cooling device in response to detecting that the electronic device exceeds a normal temperature level.

19. The method of claim 18, further comprising turning off the electronic device in response to detecting that the electronic device meets or exceeds a critical temperature level.

20. The method of claim 19, further comprising transferring data and operations from the electronic device to another device before turning off the electronic device.

* * * * *